United States Patent
Wu

Patent Number: 6,017,815
Date of Patent: Jan. 25, 2000

[54] METHOD OF FABRICATING A BORDER-LESS VIA

[75] Inventor: Chi-Hsi Wu, Taichung, Taiwan

[73] Assignee: Winbond Electronics Corp., Taiwan

[21] Appl. No.: 08/947,939

[22] Filed: Oct. 9, 1997

[30] Foreign Application Priority Data

Jun. 2, 1997 [TW] Taiwan ................................ 86107507

[51] Int. Cl.⁷ ............................................... H01L 21/4763
[52] U.S. Cl. ...................... 438/634; 438/622; 438/626; 438/627; 438/637; 438/643; 438/653; 438/970
[58] Field of Search ..................... 438/622, 626, 438/627, 634, 637, 643, 653, 970

[56] References Cited

U.S. PATENT DOCUMENTS

| | | | |
|---|---|---|---|
| 4,767,724 | 8/1988 | Kim et al. ................................ | 437/194 |
| 5,858,870 | 12/1996 | Zheng et al. ............................ | 438/622 |
| 5,858,882 | 1/1999 | Chang et al. ........................... | 438/761 |

*Primary Examiner*—Richard Booth
*Assistant Examiner*—David A. Zarneke
*Attorney, Agent, or Firm*—Rabin & Champagne, PC

[57] ABSTRACT

A method of fabricating a border-less via. A semiconductor substrate which comprises patterned metal lines, a gap therebetween, and a first dielectric layer filled within the gap is provide. A second insulating layer is formed over the metal lines and the first dielectric layer. Using a photomask, the second dielectric layer is patterned and etched to form a via. A conductive plug is formed within the via and a second conductive layer is formed over the fourth conductive layer. Thus, the first and second conductive layers are connected by the conductive plug.

21 Claims, 5 Drawing Sheets

METHOD OF FABRICATING A BORDER-LESS VIA

BACKGROUND OF THE INVENTION

1. Field of the Invention

The invention relates in general to the fabrication of semiconductor integrated circuits (ICs), and more particularly to a method of fabricating a border-less via.

2. Description of the Related Art

As methods of fabricating semiconductor devices become more and more advanced, the physical dimensions of the semiconductor devices become more and more critical. Thus, in an integrated circuit, the design rule that a via must be fabricated such that it has a border is crucial. To minimize the border of a via, and even to eliminate dimension limitations caused by the via border, are major tasks for meeting the requirements demanded of the fast-growing semiconductor fabrication industry.

Referring to FIG. 1 and FIG. 2, a conventional method of fabricating a via is shown. A conductive layer 12 is formed on a dielectric 10. By using photolithography and etching processes, the conductive layer 12 is patterned into metal lines. The gap 14 between the metal lines is filled with an insulating material. An insulating layer 16 is formed over the conductive layer 12. Again by using the photolithography and etching processes, a via 18 is patterned and then filled with metal, such as tungsten (W). Finally, another metal line is formed on top of the via 18 by which the upper conductive layer and the lower conductive layer are connected. To avoid misalignment which may be caused during the stepper or fabrication process, a border 17 normally exists around the via. That is, the conductive layer 12 must be formed such that the metal line is wide enough to prevent the via 18 being formed beyond the edge of the conductive layer 12. The existence of the via border helps to avoid the phenomenon of an open via or the etching through of the underlying layer. The "border design rule", or minimum overlap space between the conductive layer and the via, normally depends on the controllability of the stepper and the fabrication.

SUMMARY OF THE INVENTION

It is therefore an object of the invention to provide a semiconductor fabrication method for eliminating the design rule limitation for the via border. A method of fabricating a border-less via is performed by first forming a first conductive layer on a dielectric. The first conductive layer is patterned to form first metal lines. A first insulating layer is formed over the first conductive layer, and a second insulating layer is formed over the first insulating layer. A gap between the first metal lines is filled with the second insulating layer. The first and second insulating layers are then etched until the first and second insulating layers are at the same level as the first conductive layer. Third and fourth insulating layers are formed in sequence over the first and second insulating layers. Using the third insulating layer as a stop layer, an opening is patterned above the third insulating layer. Using the first and second insulating layers as stop layers, the third insulating layer is etched at a different etch selectivity until the first conductive layer is exposed, forming a via. A conductive plug is formed within the via and a second conductive layer is formed over the fourth insulating layer. Thus, the first and the second conductive layers are connected by the conductive plug.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
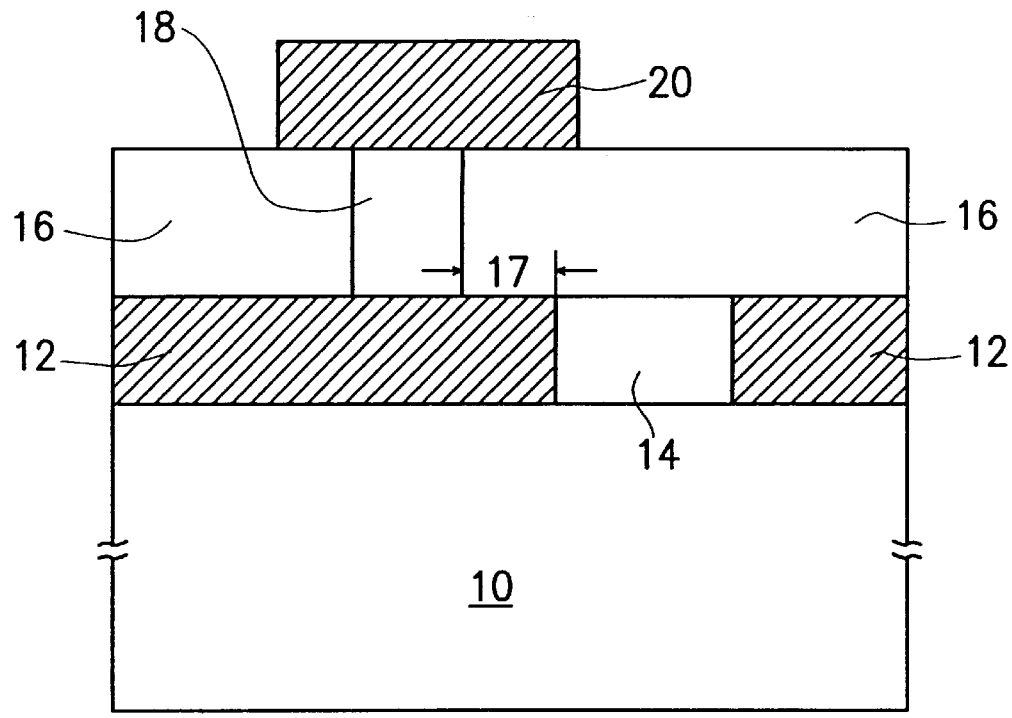
FIG. 1 is a schematic drawing of a via structure and conductive layers connected by the via in a semiconductor device.
Figure 2:
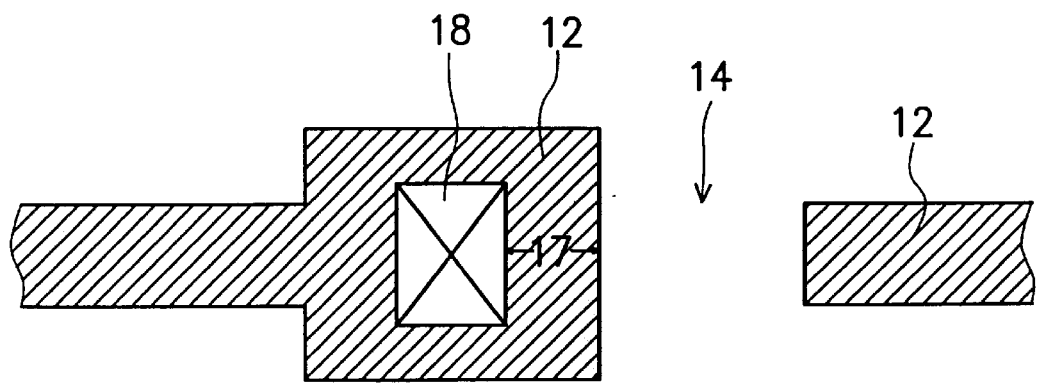
FIG. 2 shows a top view of FIG. 1.
Figure 3A:
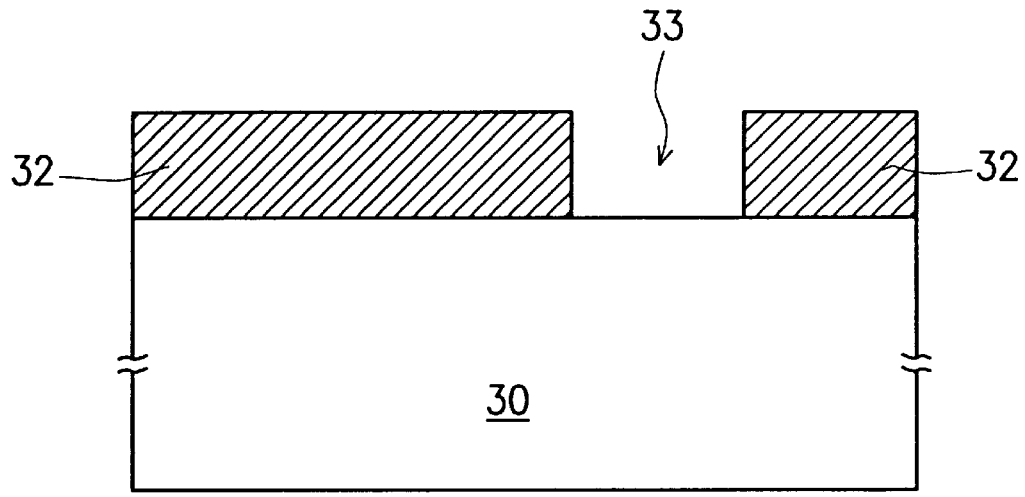
FIGS. 3A to 3G show the processing steps of a preferred embodiment of the method of the invention for fabricating a via.

First of all, referring to FIG. 3A, on a dielectric 30, a conductive layer, such as an aluminum layer, is formed, for example, by way of sputtering. By using the photolithography and etching processes, the conductive layer is patterned into metal lines 32.

Figure 3B:
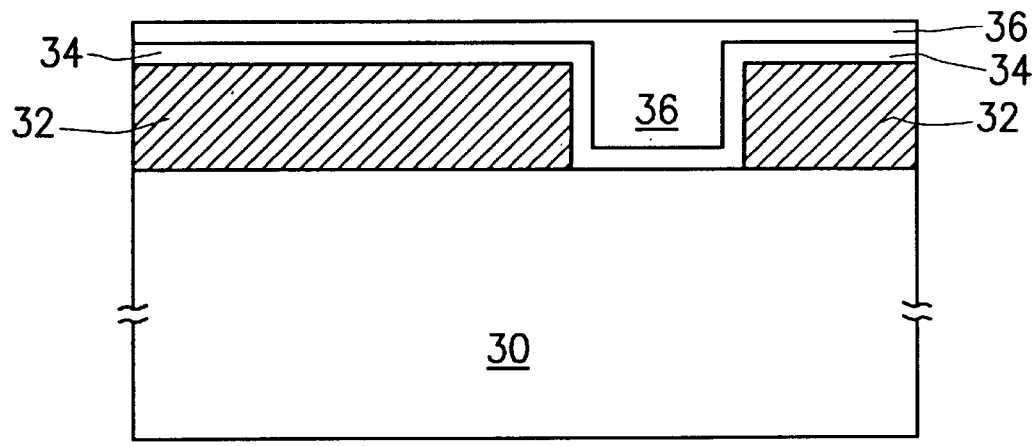

Referring to FIG. 3B, using, for example, a plasma enhanced chemical vapor deposition (PECVD) process, a silicon oxide layer 34 is formed to cover the metal lines 32 and the exposed surfaces within the gap 33 between the metal lines 32. The thickness of the silicon oxide layer 34 is preferably about 500 Å to 3000 Å. A spin-on-glass (SOG) layer 36 is formed over the silicon oxide layer 34 and filling the gap 33 for planarization.

Figure 3C:
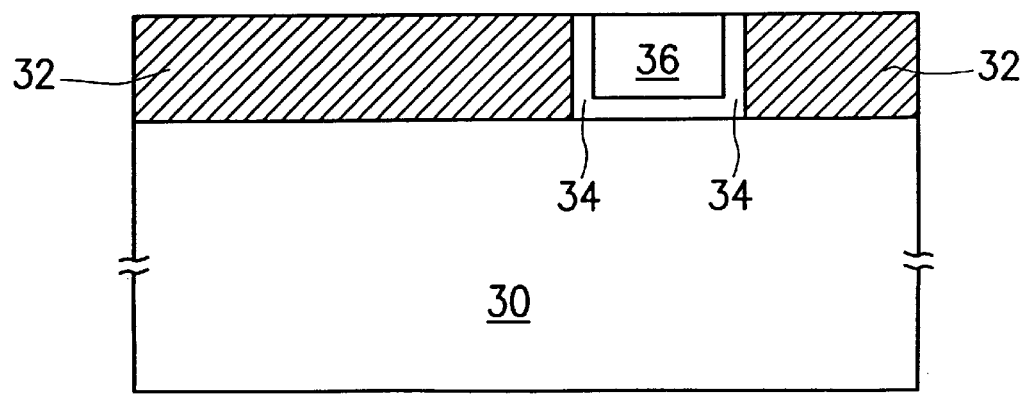

Referring to FIG. 3C, the aluminum layer is used as a stop layer for etching the silicon oxide layer 34 and the spin-on-glass layer 36, to planarize the surface.

Figure 3D:
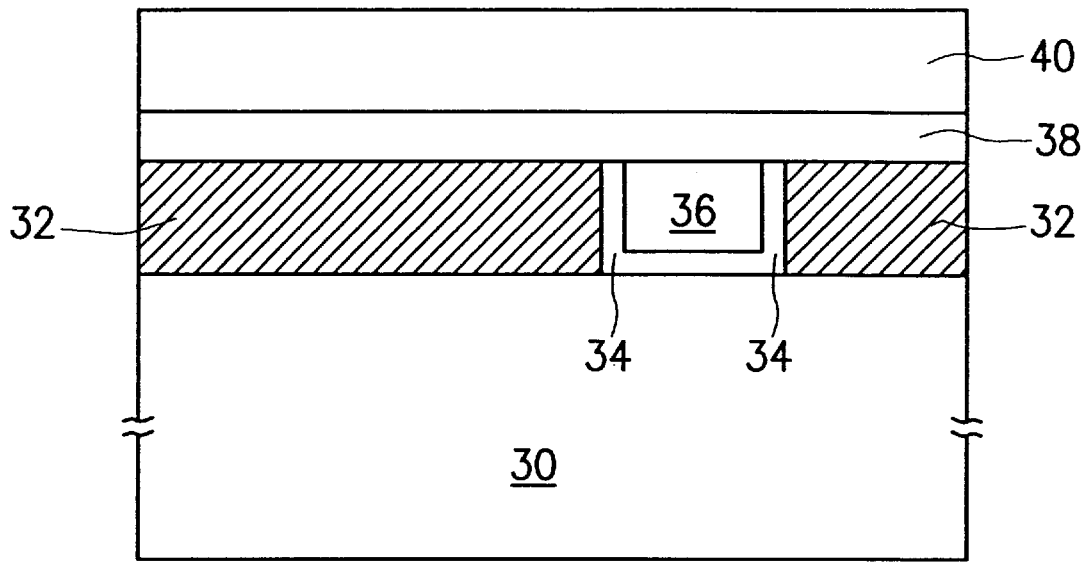

Referring to FIG. 3D, a silicon nitride layer 38 and a silicon oxide layer 40 are formed in sequence over the aluminum layer and spun-on glass (SOG) layer. The silicon nitride layer 38, having a preferred thickness of about 200 Å to 2000 Å, is used as a buffer layer and an etch stop layer for the following etching step. The silicon oxide layer 40 is formed by plasma enhanced chemical vapor deposition and has a preferred thickness of about 2000 Å to 7000 Å.

Figure 3E:
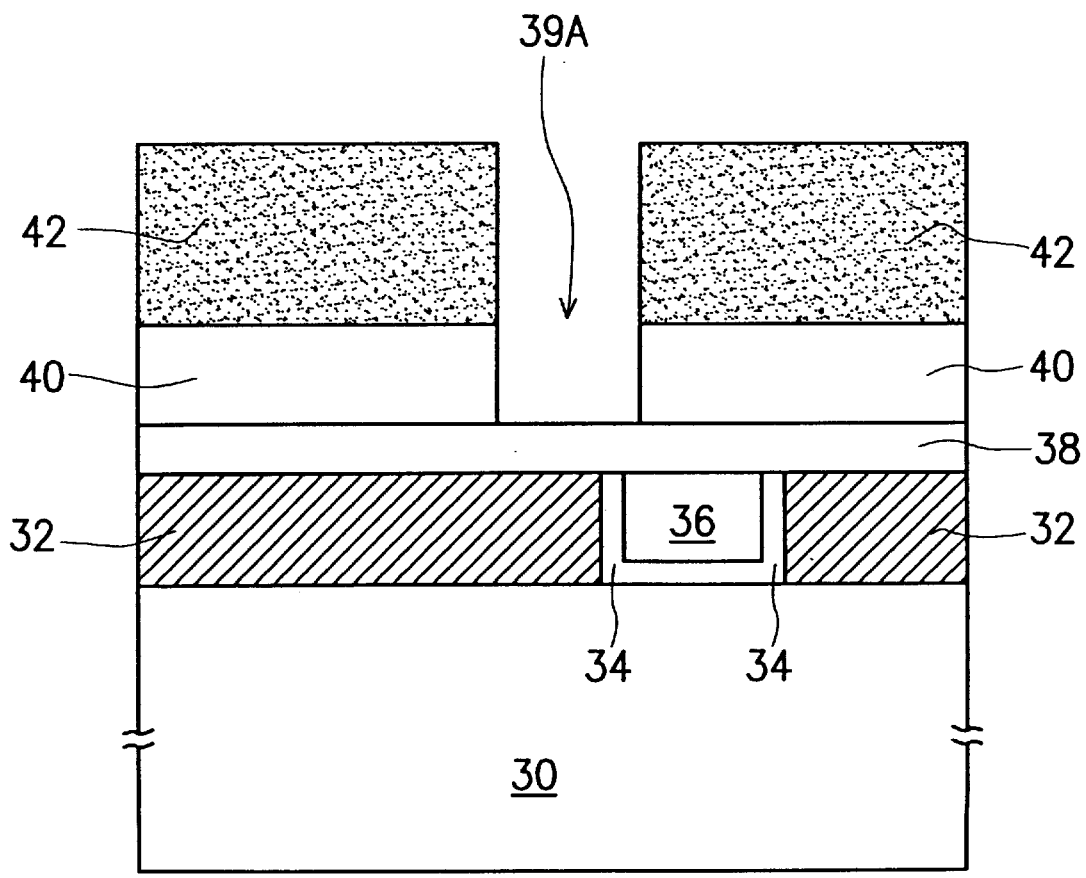

Referring to FIG. 3E, a photoresist layer 42 is coated over the silicon oxide layer 40. By a photolithography process, an opening 39A is formed in the position predetermined for a via. The silicon oxide layer 40 is then anisotropically etched to the silicon nitride stop layer, to define a via. The etching process used here is a dry etching process with a selectivity chosen such that the etching rate is more than fifty times quicker for the silicon oxide layer 40 than for the silicon nitride layer 38.

Figure 3F:
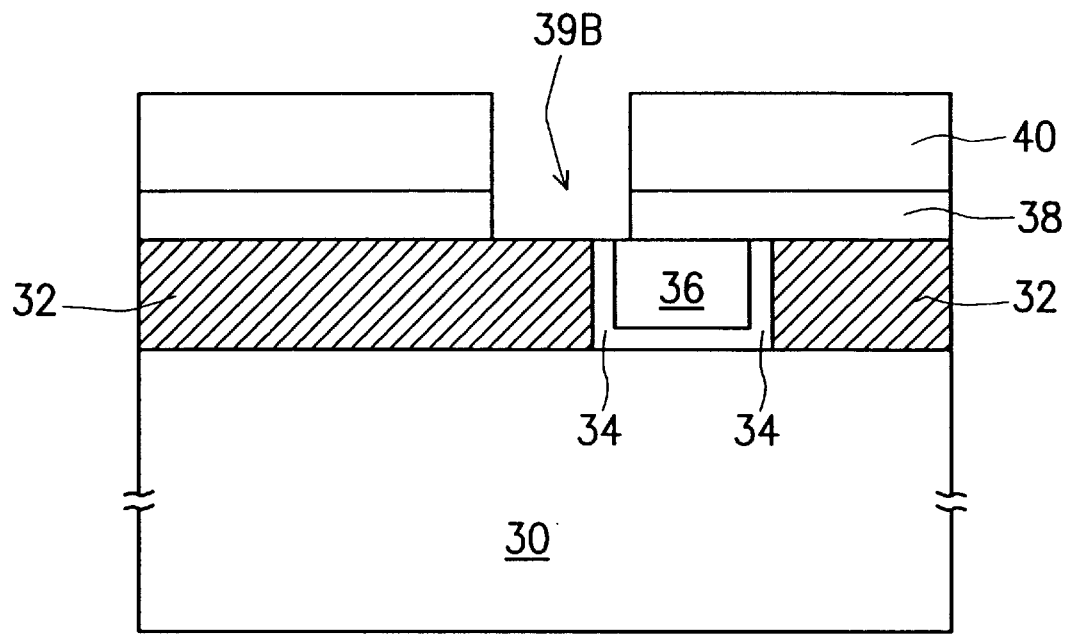

Referring to FIG. 3F, the photoresist layer is removed and a second etching process is performed, until the surface of the aluminum layer 32 is exposed. The second etching process has a selectivity chosen such that the etching rate is more than fifty times quicker for the silicon nitride layer 38 than for both of the silicon oxide layer 34 and the aluminum layer 32. The via 39B is thus defined. If any misalignment occurs during the process of forming the via, then due to the very slow etching rate for the silicon oxide layer 34 and the SOG layer 36, the underlying layer is not etched, preventing the formation of an short circuit. Therefore, a border-less via is formed without the limitation of following the border design rule.

Figure 3G:
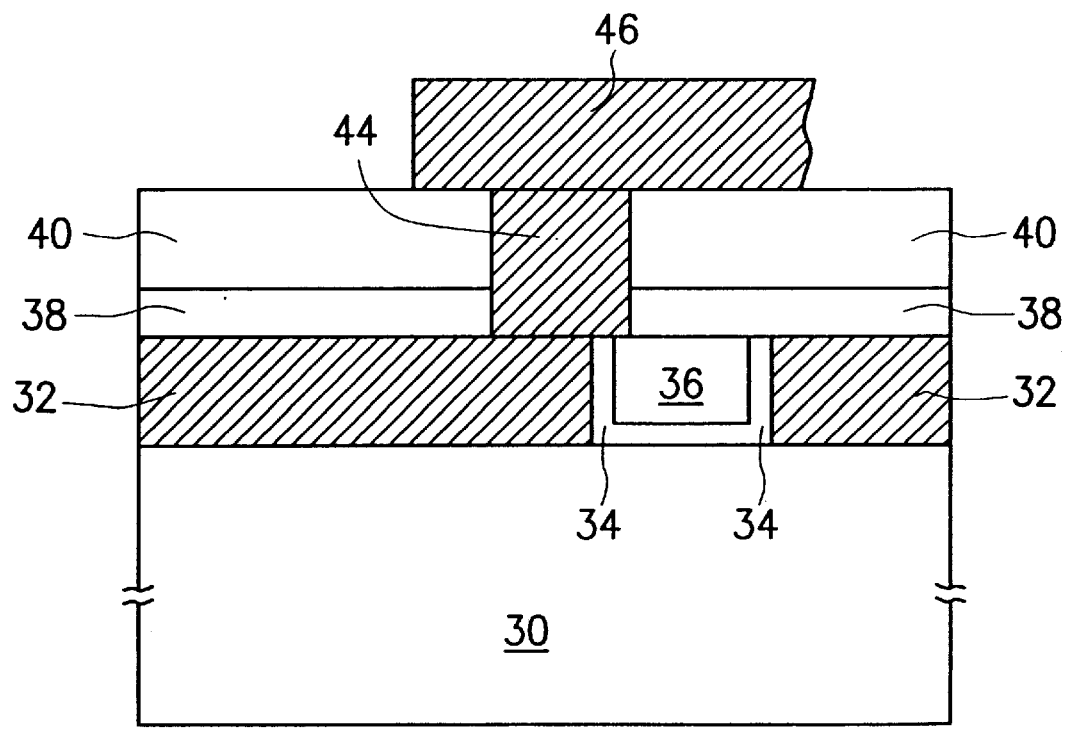
Figure 4:
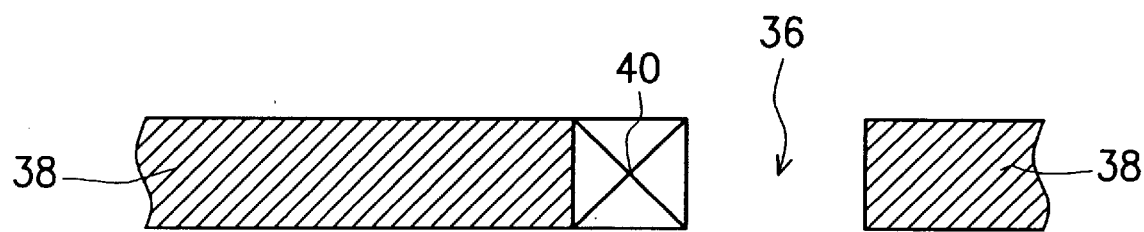
FIG. 4 shows a top view of FIG. 3G.

Referring to FIG. 3G, a tungsten plug 44 is formed within the via, and then a conductive layer 46, such as an aluminum layer, is formed over the silicon oxide layer 40 and on top of the via as well. The conductive layer 32 and the conductive layer 46 are thus connected by the tungsten plug.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a border-less via, comprising:
   a. providing a substrate, which comprises forming a plurality of patterned metal lines having gaps between respective ones of the metal lines, and forming a first insulating layer in one of the gaps;
   b. forming a second insulating layer over the substrate, wherein the second insulating layer is composed of a different material than a material composing the first insulating layer;
   c. using a photomask, patterning and etching the second insulating layer to form a via exposing a surface area of one of the metal lines, wherein the etching is performed at a selectivity such that the second insulating layer has an etching rate that is more than fifty times quicker than an etching rate of the first insulating layer;
   d. forming a conductive plug within the via; and
   e. forming a second conductive layer over the second insulating layer, so that the second conductive layer contacts the conductive plug.

2. The method of claim 1, wherein forming the first insulating layer comprises
   forming a first sub-layer, and
   forming a second sub-layer, which is a SOG layer, separately from forming the first sub-layer.

3. The method of claim 2, wherein the first sub-layer has a thickness between about 500 Å and about 3000 Å.

4. The method of claim 3, further comprising planarizing the second sub-layer to a level that is the same as a level of the metal lines.

5. The method of claim 4, wherein forming the second sub-layer includes utilizing a spin-on-glass technique, and planarizing the second sub-layer includes performing chemical-mechanical polishing.

6. The method of claim 1, further comprising forming a third insulating layer before patterning the second insulating layer.

7. The method of claim 6, wherein the second insulating layer has a thickness between about 200 Å and about 2000 Å.

8. The method of claim 7, wherein the third insulating layer has a thickness between about 2000 Å and about 7000 Å.

9. The method of claim 8, wherein further comprises patterning the third insulating layer, including anisotropically dry etching the third insulating layer, at a selectivity such that an etching rate for the third insulating layer is more than fifty times faster than an etching rate for the second insulating layer, using the second insulating layer as a stop layer.

10. The method of claim 1, wherein etching the second insulating layer includes anisotropically dry etching the second insulating layer at a selectivity such that an etching rate for the second insulating layer is more than fifty times quicker than an etching rate for the first insulating layer.

11. The method of claim 1, wherein the conductive plug is a tungsten plug.

12. The method of claim 1, wherein the second insulating layer is etched such that the surface area of the one of the metal lines exposed by the via is located directly adjacent the first insulating layer formed in the one of the gaps.

13. The method of claim 12, wherein the via also exposes a surface area of the first insulating layer formed in the one of the gaps.

14. A method of fabricating a border-less via, comprising:
   a. forming a first conductive layer on a semiconductor substrate, and patterning the first conductive layer to form a plurality of first metal lines and a plurality of gaps, ones of said plurality of gaps being located between adjacent ones of each of the plurality of the first metal lines;
   b. forming a first insulating layer, within said gaps and covering the first metal lines;
   c. forming a second insulating layer over the first insulating layer, so that each gap is filled with the second insulating layer;
   d. planarizing the first insulating layer and the second insulating layer until the first insulating layer and the second insulating layer are at a same level as an upper surface of the first conductive layer;
   e. forming a third insulating layer and a fourth insulating layer in sequence over the first conductive layer and the second insulating layer;
   f. patterning the fourth insulating layer, using the third insulating layer as a stop layer, to form an opening above the third insulating layer;
   g. etching the third insulating layer through the opening until an upper surface area of the first conductive layer is exposed, forming a via through the third insulating layer and the fourth insulating layer;
   h. forming a conductive plug within the via; and
   i. forming a second conductive layer over the fourth insulating layer, so that second conductive layer contacts the conductive plug;
   wherein
   patterning the fourth insulating layer includes anisotropically dry etching the fourth layer, at a selectivity such that an etching rate for the fourth insulating layer is more than fifty times faster than an etching rate for the third insulating layer, using the third insulating layer as a stop layer; and
   etching the third insulating layer includes anisotropically dry etching the third insulating layer at a selectivity such that an etching rate for the third insulating layer is more than fifty times quicker than an etching rate for the second insulating layer.

15. The method of claim 14, wherein the first insulating layer is a silicon oxide layer, the second insulating layer is a SOG layer, the third insulating layer is a silicon nitride layer, and the fourth insulating layer is a silicon oxide layer.

16. The method of claim 14, wherein the first insulating layer has a thickness between about 500 Å and about 3000 Å.

17. The method of claim 14, wherein the third insulating layer has a thickness between about 200 Å and about 2000 Å.

18. The method of claim 14, wherein the fourth insulating layer has a thickness between about 2000 Å and about 7000 Å.

19. The method of claim 14, wherein the conductive plug is a tungsten plug.

20. The method of claim 14, wherein the upper surface area of the first conductive layer exposed by etching the third insulating layer is located directly adjacent the first insulating layer formed in one of the gaps.

21. The method of claim 20, wherein etching the third insulating layer also exposes an upper surface area of the first insulating layer formed in the one of the gaps.

* * * * *